United States Patent [19]

Doland

[11] Patent Number: 4,680,765
[45] Date of Patent: Jul. 14, 1987

[54] AUTOSYNC CIRCUIT FOR ERROR CORRECTING BLOCK DECODERS

[76] Inventor: George D. Doland, 1602 Redway La., Houston, Tex. 77062

[21] Appl. No.: 759,252

[22] Filed: Jul. 26, 1985

[51] Int. Cl.$^4$ ............................................. G06F 11/10
[52] U.S. Cl. ......................................... 371/42; 371/47
[58] Field of Search .............................. 371/47, 49, 42

[56] References Cited

U.S. PATENT DOCUMENTS

| 3,587,043 | 6/1971 | Mengani | 371/47 |
| 3,820,083 | 6/1974 | Way | 371/49 |
| 3,938,086 | 2/1976 | Valbonesi | 371/42 |
| 4,412,329 | 10/1983 | Yarborough, Jr. | 371/47 |
| 4,425,645 | 1/1984 | Weaver et al. | 371/47 |

Primary Examiner—Charles E. Atkinson

[57] ABSTRACT

Error correcting decoders fall into two catagories, block decoders and convolutional decoders. In either case, the decoder must be synchronized with the received data. For block decoders, an external signal such as that produced by a Frame Synchronizer can be used for this purpose. For many applications, it is preferable to have the decoder acquire synchronization automatically without the need for an external device. This disclosure describes a circuit for automatically synchronizing a block decoder. When the usual or conventional methods are used, a special pattern called the Frame Sync Signal must be transmitted. In this new improved circuit, the synchronization information is contained in the error correcting code with no additional bits being required for synchronization and no reduction in error correcting capability. Because of the relative simplicity of the circuit, it may be incorporated within the decoder or optionally, it may be contained in a separate device. As the principles for operation are so vastly different than other synchronizers, the circuit when produced as a separate device could be correctly called a Decoder Synchronizer. The Autosync Circuit has applications for Error Correcting Decoders which use either short or long block codes.

3 Claims, 1 Drawing Figure

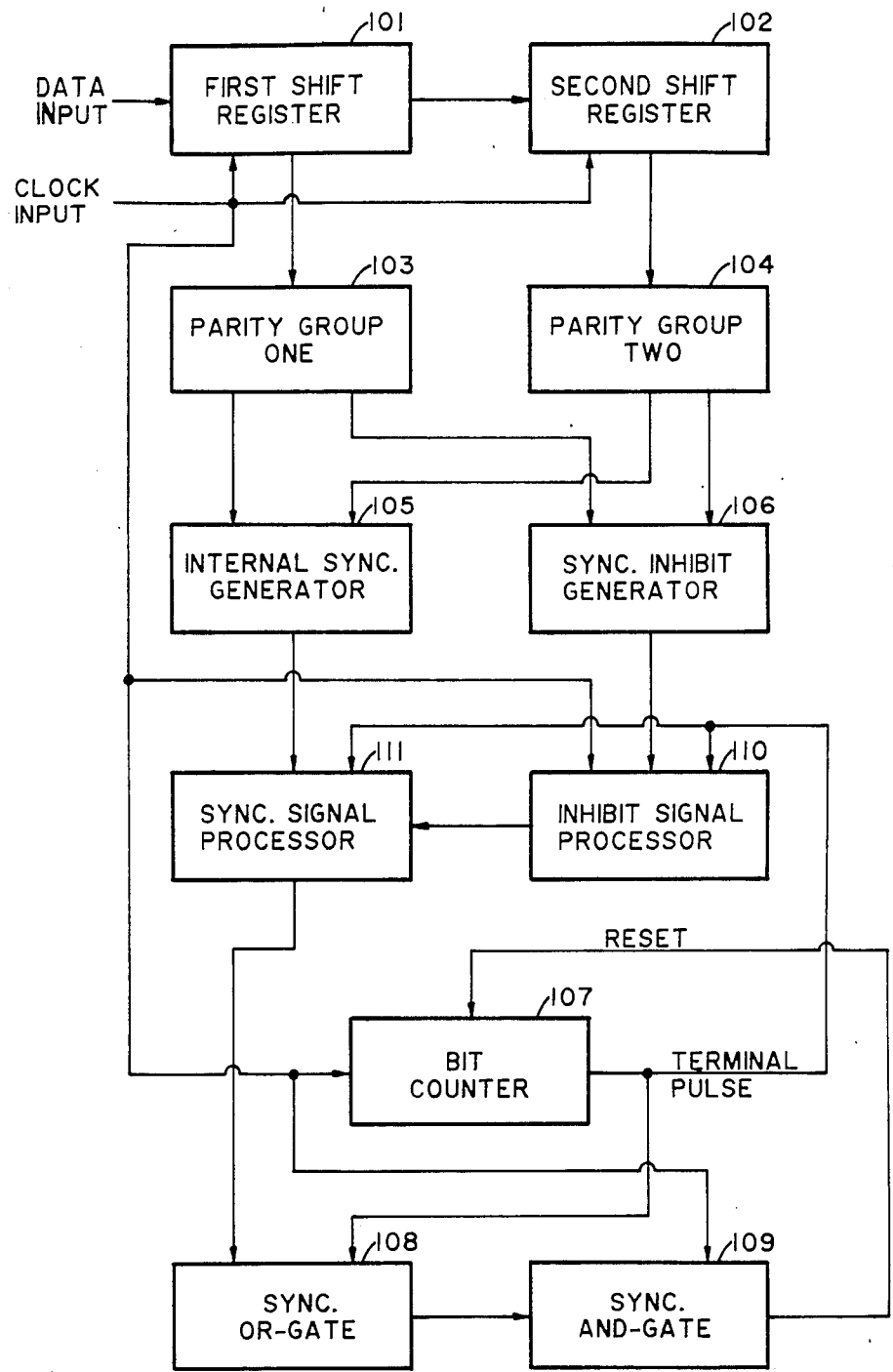
FIGURE

AUTOSYNC CIRCUIT FOR ERROR CORRECTING BLOCK DECODERS

BACKGROUND FOR THE INVENTION

This invention generally relates to new and useful improvements in the synchronization circuit for forward error correction decoders used in digital communications systems. More particularly, novel features include the method for acquiring synchronization and the method for maintaining synchronization. There are many different types of forward error correction decoders which may use one of a very large number of different codes. As an example, the Autosync Circuit may be used in the decoders of Doland, described in U.S. Pat. No. 4,038,636, Multiple Decoding System. It may also be used in either hard or soft decision decoders using the extended Golay (24-12) multiple error correcting code.

BRIEF DESCRIPTION OF THE DRAWING

The FIGURE is a Block Diagram illustrating the preferred embodiment of the Autosync Circuit.

DESCRIPTION OF THE PREFERRED EMBODIMENT

There are two common methods for generating the code bits for a block code, (1) a Hamming Matrix Encoder and (2) a Polynomial Encoder. For the Polynomial Encoder, the code bits generally follow the data or information bits. The code bits also are generally produced using even parity. Typically, Hamming Matrix Encoders are implemented in the same fashion. This implementation is unsatisfactory for Autosync Circuit operation. If there are several digital data words which are all ones or all zeros, a continuous block of ones or zeros is produced. It is not possible to determine the start of a new word when in the central region of the continuous block. However, if odd parity is used, the parity bits will be ones for all zeros data and vice versa. In the preferred embodiment, odd parity is used and the code or parity bits are distributed throughout the entire word. Alternatively, a combination of even and odd parity may be used. In this case, some parity bits would be produced using odd parity and the others using even parity. The autocorrelation function for the pattern produced with all zeros for the information bits should be low except for the synchronous position where it will be one. Neither the parity used nor the sequence of the bits effect the error correcting capability of the code in any way. The transitions are also desirable for Bit Synchronizer operation. With a Hamming Matrix Encoder, odd parity can be used and the bits can be arranged in any desired sequence.

The Decoder must be designed to operate with the channel bit sequence produced by the Encoder. If the code word is short of has few parity bits, four words must be used for synchronization. The (16-11) code used in the Multiple Decoding System of the referenced patent has only five code bits. For most applications but not necessarily all, satisfactory autosync performance will require four words for synchronization. The (24-12) Extended Golay Code will operate satisfactory with two words. For very long codes with many code bits, one word will be sufficient. It is necessary to have two groups of code bits with 10 to 16 bits in each group. This requirement is met for the two codes mentioned. The autosync circuit is described with reference to the extended Golay (24-12) code and uses two words for synchronization. One skilled in the art can apply the principles described to obtain satisfactory operation with other codes.

With reference to the FIGURE, the received bit stream is fed to the First Shift Register (101) and then to the Second Shift Register (102). These are serial input and parallel output shift registers one word long. They may also be one long shift register divided into two sections only for the purpose of explaning the circuit operation. The parallel outputs from the First Shift Register (101) are fed to Parity Group One (103) and the parallel outputs from the Second Shift Register (102) are fed to Parity Group Two (104). Each parity group consists of a parity generator for each parity bit. A parity bit is fed to each parity generator. Also fed to that parity generator are the bits used to produce the parity bit. The implementation is such that when a complete digital word is stored in the First Shift Register One (101), the parallel outputs fed to Parity Group One (103) produce a logic one output for each parity generator in the group. These signals are fed to an and-gate within Parity Group One (103) and a single logic one appears at the output. Similarly for Parity Group Two (104).

The Internal Sync Generator (105) is an and-gate which combines the signals from Parity Group One (103) and Parity Group Two (104). The Sync Inhibit Generator (106) is an or-gate which combines the same signals, the Parity Group One (103) output and the Parity Group Two (104) output. It is imperative that an output from the Internal Sync Generator (105) is produced only when the signal in the First Shift Register (101) and the Second Shift Register (102) are in the proper position to synchronize the Decoder. If there is an error in the received signal for one of the words, the Internal Sync Signal will not be produced. If the other word is correct, the Sync Inhibit Signal will still be generated.

Typically, the timing of a Block Decoder is controlled by a Timer containing a counter. This counter is shown in the FIGURE as the Bit Counter (107). Usually a count-down counter is used which is preset to the number of bits in the code word. When the count reaches zero, a Terminal Pulse is produced. The counter remains at the zero count for one-half of a bit period and then is preset and remains at the preset number for the second half of the bit period. The Bit Counter (107) is implemented so that it counts continuously. Synchronization is achieved when the Bit Counter (107) is preset during the correct bit period. A sync pulse is applied to the Bit Counter (107) for this purpose but requires additional circuitry. The Sync Or-Gate (108) combines the sync signal with the Terminal Pulse. The output of the Sync Or-Gate (108) is fed to the Sync And-Gate (109) where is is combined with the clock. The clock permits the signal to pass through the Sync And-Gate (109) only during the last half of the bit period to preset the counter. The Sync Or-Gate (108) and Sync And-Gate (109) permit the counter to count continuously with no sync signal present. Once synchronized, the Bit Counter (107) and Decoder will remain in synchronism with no additional sync information.

If no false sync pulses could be produced, it would only be necessary to feed the Internal Sync Signal from the Internal Sync Generator (105) to the Sync Or-Gate (108). For many codes, false sync signals will be produced with particular error combinations in the received bit stream for the data present at that time. In some cases, false sync signals can also be produced for particular word sequences. These false sync signals will disrupt synchronization and must be eliminated. This is done with the circuit shown in the FIGURE with additional processing of the Internal Sync Signal and the Sync Inhibit Signal.

The Terminal Pulse from the Bit Counter (107) is shortened so that it occurs for only the first one-half of a bit period. This pulse is used to gate the Sync Inhibit Signal from the Sync Inhibit Generator (106) so that the Sync Inhibit Signal only occurs during the first half of any bit period. The Terminal Pulse is also fed to a flip-flop so the the output is a logic one after the leading edge of the Terminal Pulse from the Bit Counter (107). The flip-flop is reset by the shortened Sync Inhibit Signal. These functions are located in the Inhibit Signal Processor (110) shown in the FIGURE. The purpose for the Inhibit Signal Processor (110) is to allow only one Sync Inhibit Signal to pass through the Inhibit Signal Processor (110) each data word period. The output from the Inhibit Signal Processor (110) is taken from the flip-flop.

The Internal Sync Signal must also be processed. This is accomplished in the Sync Signal Processor (111). The first step is to gate the Internal Sync Signal using the output of the Inhibit Signal Processor (110). Since only one Inhibit Signal is produced each word period, only one Internal Sync Signal will pass through this gate each word period. The Internal Sync Signal is also gated by a second gate within the Sync Signal Processor (111). The signal used to control this gate is produced by two flip-flop circuits also within the Sync Signal Processor (111). The Terminal Pulse from the Bit Counter (107) is fed to the first flip-flop which causes the output of the flip-flop to be a logic one until reset. It is reset by a signal from the second gate within the Internal Sync Processor (111). Alternatively, and preferably with some designs, the first flip-flop may be reset by the output of the Inhibit Signal Processor (110). The output of the first flip-flop is fed to the input of the second flip-flop. The Clock Signal is fed to the clock input of this flip-flop so that the output signal state is made equal to the input signal state at the transition in the middle of the clock period. The output of this second flip-flop is fed to the second gate in the Sync Signal Processor (111). The output of the Sync Signal Processor (111) is taken from the output of the second gate. This signal is fed to the Sync Or-Gate (108).

The objective of the preferred embodiment is a circuit which readily acquires synchronization but is difficult to cause a loss in synchronization by false signals. The circuit described has these properties. False signals can be produced by a parity group when there are specific errors for the data which is contained in a digital word. These false signals are rare random occurrences. They occur more rarely for two consecutive words and occur even less frequently at the same time for two consecutive words. Never-the-less, with billions upon billions of data bits, these false signals will be a problem unless suppressed. Suppression of false sync signals is a characteristic of the preferred embodiment described. False signals from a Parity Group will cause false signals to appear at the input to the Inhibit Signal Processor (110) and when false signals occur simutaneously from both Parity Groups, a false signal will appear at the input of the Sync Signal Processor (111). The combined effect of the Inhibit Signal Processor (110) and the Sync Signal Processor (111) is to eliminate these false signals.

At start-up or after a loss of the signal, the Decoder is likely to be out of synchronization. It will take at least 48 channel bits to load two complete words into the decoder for processing. Regardless of where the Bit Counter (107) starts, the output of the second flip-flop in the Sync Signal Processor (111) will enable the second gate, also in the Sync Signal Processor (111), to pass any sync signal which is present at the input to the second gate to pass through the gate. When there is a complete word in each the First Shift Register (101) and the Second Shift Register (102), a pulse will occur at the output of Parity Group One (103) and Parity Group Two (104). These signals will be combined to produce an Inhibit Sync Signal at the output of the Sync Inhibit Generator (106) and an Internal Sync Signal at the output of the Sync signal Generator (105). The Internal Sync Signal will pass through the Sync Signal Processor (111) and be available during the last half of a clock cycle to preset the Bit Counter (107). Since the Decoder timing is controlled by the Bit Counter (107), synchronization of the Decoder will be achieved when two complete error free words are received.

After synchronization is obtained, the Decoder will remain in synchronization even if no sync signal is received unless the Bit Synchronizer losses sync or slips a bit, or unless false sync signals cause a loss of synchronization. We can now examine the performance of the circuit described with errors. Assume that all words have no errors except one which is preceded and followed by words with no errors. When the last word preceding the word with errors enter the First Shift Register (101), a sync signal will be produced which will pass through the circuits and occur at the correct time to preset the Bit Counter (107) although unnecessary. This process will prevent acceptance of any false signals for a complete word period when the word with errors will enter the First Shift Register (101). A Sync Inhibit Signal will be generated because of the correct word in Shift Register Two (102) but an Internal Sync Signal will not be produced because of the error in the First Shift Register (101). The flip-flop in the Inhibit Signal Generator (110) will be reset and the first gate in the Sync Signal Processor (111) will be opened preventing false signals from passing through for one word period more.

During this one word period, the word with an error will be transferred from the First Shift Register (101) to the Second Shift Register (102). The same sequence of events described in the preceding paragraph will take place. False signals will be blocked for another word period at the first flip-flop in the Sync Signal Processor (111). During this word period, the word with the error will be shifted out of the Second Shift Register (101) and error free words will be in both the First Shift Register (101) and the Second Shift Register (102). The Decoder cannot loose synchronization with errors in only one word. If there are errors in two consecutive words, the acquisition circuit is activated but the Decoder may remain in synchronization. Synchronization is lost only when there are two or more words with errors followed by a false sync signal.

The ability to maintain synchronization with little change in the acquisition properties can be obtained by using three or more words to generate the Sync Inhibit Signal while still using only two for producing the Internal Sync Signal. While the circuit was described with the Golay code, one skilled in the art can readily apply the principles to an Autosync Circuit for a Decoder using the code described in the Multiple Decoding System and other block codes.

If the code or operating conditions are such that false sync signals cannot be produced, the circuit can be greatly simplified by omitting the Sync Inhibit Signal circuitry and some of the processing. One of the major novel features of this Autosync Circuit is that a sync pattern is not required and the characteristics of the code provide the synchronizing information. A search pattern is not required to acquire synchronization. Synchronization is achieved immediately upon receipt of the required number of error free bits. Another major novel feature is the ability to maintain synchronization with errors in the received signal which is necessary for an error correcting decoder. As used herein, a parity generator is any devise which produces the modulo-2 sum output for a plurality of input signals.

I claim:

1. An autosync circuit for synchronizing decoders for digital communications which use block codes, and which does not require a sync pattern in the digital data signal but uses a plurality of parity bits in each digital word, said apparatus comprising, a plurality of word length shift registers connected in series into which the serial digital data signal is shifted using an external clock from the data source and said shift registers having an output from each stage of the shift registers, a means for checking the parity of the bit group for each parity bit in the digital word in the first of said shift registers, using the outputs from each stage of said first shift register, and a means for combining the output of said parity checking means so as to produce a single signal output signifying that the parity is true for all parity bit groups of said digital word in the first shift register, means for checking the parity of each bit group for each parity bit in each of the other digital words in each of the plurality of said shift registers with means for combining the outputs of said parity checking means so as to produce a single output for each digital word signifying that the parity is true for all parity bit groups of the digital word.

a means for combining the outputs of said parity checking means for each of the plurality of digital words in the said plurality of shift registers, said signal signifying that the parity is true for all parity groups of the said digital words, and said signal being the synchronizing signal.

2. An autosync circuit as defined in claim 1 and including, a counter means which is reset by said synchronizing signal from said means to combine the parity checking signal for each of the digital words of said shift registers, and said counter output being a synchronizing signal each word.

3. An autosync circuit as defined in claim 1 and including, a means to combine the outputs of said parity checking means for each of the digital words of said shift registers so that the output of said combining means is a signal signifying that the parity is true for all parity bit groups of at least one digital word, and said signal being called a sync inhibit signal for reference, a circuit means to combine said synchronizing signal and said sync inhibit signal such that the synchronizing signal output of said circuit means is inhibited for one word period for each sync inhibit signal input to said circuit means, said circuit means prevents false sync signal output for one word period each sync inhibit signal input to said circuit means.

* * * * *